United States Patent
Southwick et al.

(10) Patent No.: US 7,491,641 B2
(45) Date of Patent: Feb. 17, 2009

(54) METHOD OF FORMING A CONDUCTIVE LINE AND A METHOD OF FORMING A CONDUCTIVE CONTACT ADJACENT TO AND INSULATED FROM A CONDUCTIVE LINE

(75) Inventors: Scott A. Southwick, Boise, ID (US); Alex J. Schrinsky, Boise, ID (US); Terrence B. McDaniel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 279 days.

(21) Appl. No.: 11/412,524

(22) Filed: Apr. 27, 2006

(65) Prior Publication Data

US 2006/0189128 A1 Aug. 24, 2006

Related U.S. Application Data

(62) Division of application No. 10/925,158, filed on Aug. 23, 2004, now Pat. No. 7,118,966.

(51) Int. Cl.
H01L 21/4763 (2006.01)
(52) U.S. Cl. .................. 438/639; 438/259; 438/429; 438/430; 438/642; 438/648
(58) Field of Classification Search .................. 438/639, 438/642, 648, 259, 429, 430
See application file for complete search history.

(56) References Cited

U.S. PATENT DOCUMENTS

| | | | |
|---|---|---|---|
| 4,661,202 A | 4/1987 | Ochii | |
| 5,422,296 A * | 6/1995 | Lage | ............... 438/212 |
| 5,573,969 A | 11/1996 | Kim | |
| 5,614,765 A | 3/1997 | Avanzino et al. | |
| 5,920,098 A | 7/1999 | Liaw | |

(Continued)

FOREIGN PATENT DOCUMENTS

EP 0457131 A1 11/1991

OTHER PUBLICATIONS

Wolf et al., Silicon Processing For The VLSI Era, vol. 1: Process Technology, pp. 5 and 6 (Lattice Press 1986).

(Continued)

*Primary Examiner*—Zandra Smith
*Assistant Examiner*—Colleen E Rodgers
(74) *Attorney, Agent, or Firm*—Wells St. John P.S.

(57) ABSTRACT

This invention includes methods of forming conductive lines, and methods of forming conductive contacts adjacent conductive lines. In one implementation, a method of forming a conductive line includes forming a conductive line within an elongated trench within first insulative material over a semiconductive substrate. The conductive line is laterally spaced from opposing first insulative material sidewall surfaces of the trench. The conductive line includes a second conductive material received over a different first conductive material. The second conductive material is recessed relative to an elevationally outer surface of the first insulative material proximate the trench. A second insulative material different from the first insulative material is formed within the trench over a top surface of the conductive line and within laterally opposing spaces received between the first insulative material and the conductive line. In one implementation, a conductive contact is formed adjacent to and insulated from the conductive line.

27 Claims, 6 Drawing Sheets

U.S. PATENT DOCUMENTS

| | | | |
|---|---|---|---|
| 5,970,375 | A | 10/1999 | Gardner et al. |
| 6,008,084 | A | 12/1999 | Sung |
| 6,011,712 | A | 1/2000 | Lee |
| 6,017,813 | A | 1/2000 | Kuo |
| 6,027,994 | A | 2/2000 | Huang et al. |
| 6,071,804 | A | 6/2000 | Gau |
| 6,133,116 | A | 10/2000 | Kim et al. |
| 6,180,494 | B1 | 1/2001 | Manning |
| 6,258,709 | B1 | 7/2001 | McDaniel |
| 6,261,908 | B1 | 7/2001 | Hause et al. |
| 6,271,125 | B1 | 8/2001 | Yoo et al. |
| 6,287,965 | B1 | 9/2001 | Kang et al. |
| 6,337,274 | B1 | 1/2002 | Hu et al. |
| 6,346,438 | B1 | 2/2002 | Yagishita et al. |
| 6,350,679 | B1 | 2/2002 | McDaniel et al. |
| 6,365,504 | B1 | 4/2002 | Chien et al. |
| 6,376,380 | B1 | 4/2002 | Tang et al. |
| 6,394,883 | B1 | 5/2002 | Carlson et al. |
| 6,461,225 | B1 | 10/2002 | Misra et al. |
| 6,489,234 | B1 * | 12/2002 | Itoh ................ 438/639 |
| 6,498,088 | B1 | 12/2002 | Trivedi |
| 6,720,269 | B2 | 4/2004 | Park et al. |
| 6,724,054 | B1 | 4/2004 | Kang et al. |
| 6,730,570 | B2 | 5/2004 | Shin et al. |
| 6,867,497 | B2 | 3/2005 | Trivedi |
| 6,876,497 | B2 | 4/2005 | Lee et al. |
| 2001/0003663 | A1 | 6/2001 | Huang |
| 2002/0072224 | A1 | 6/2002 | Huang et al. |
| 2005/0277264 | A1 | 12/2005 | Cheng et al. |
| 2006/0073695 | A1 | 4/2006 | Filippi et al. |

OTHER PUBLICATIONS

U.S. Appl. No. 09/976,635, filed Oct. 2001, Trivedi.

U.S. Appl. No. 10/222,305, filed Aug. 2002, Trivedi.

* cited by examiner

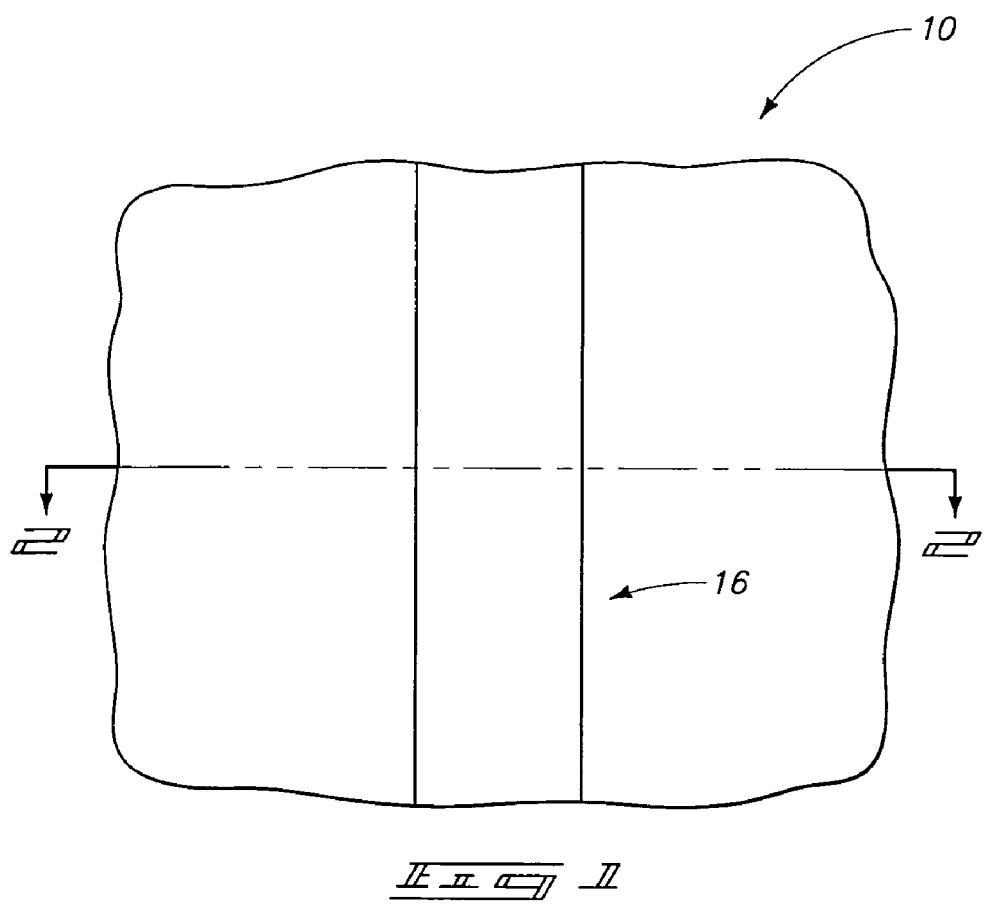
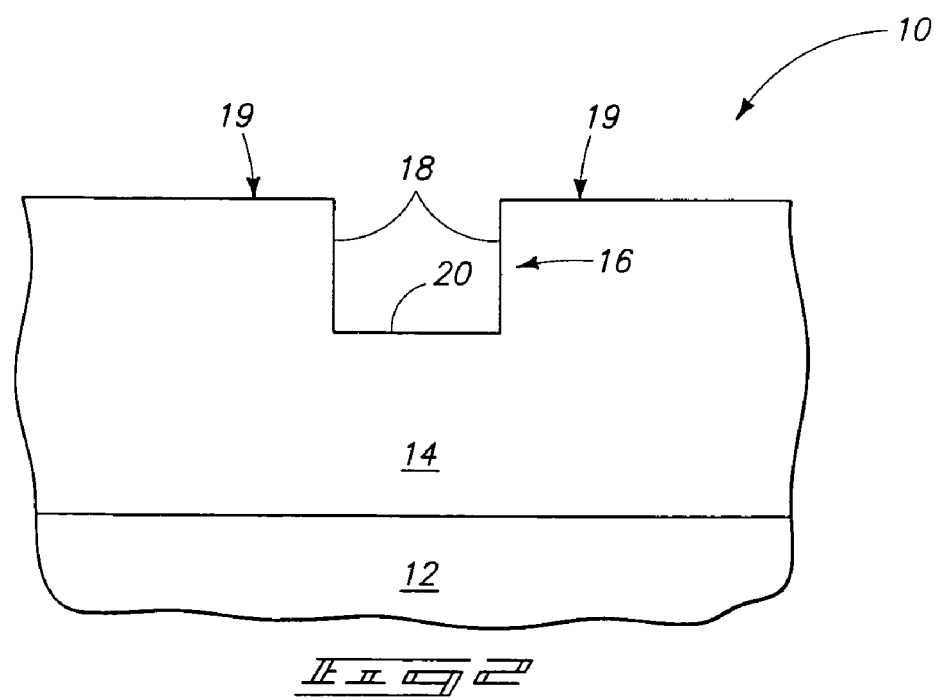

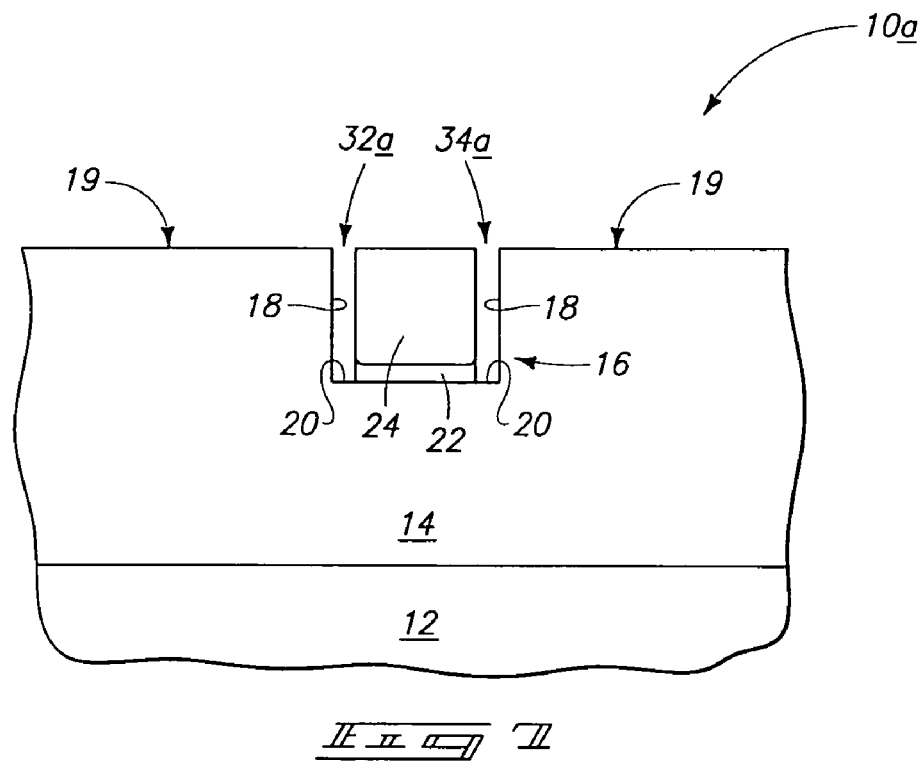
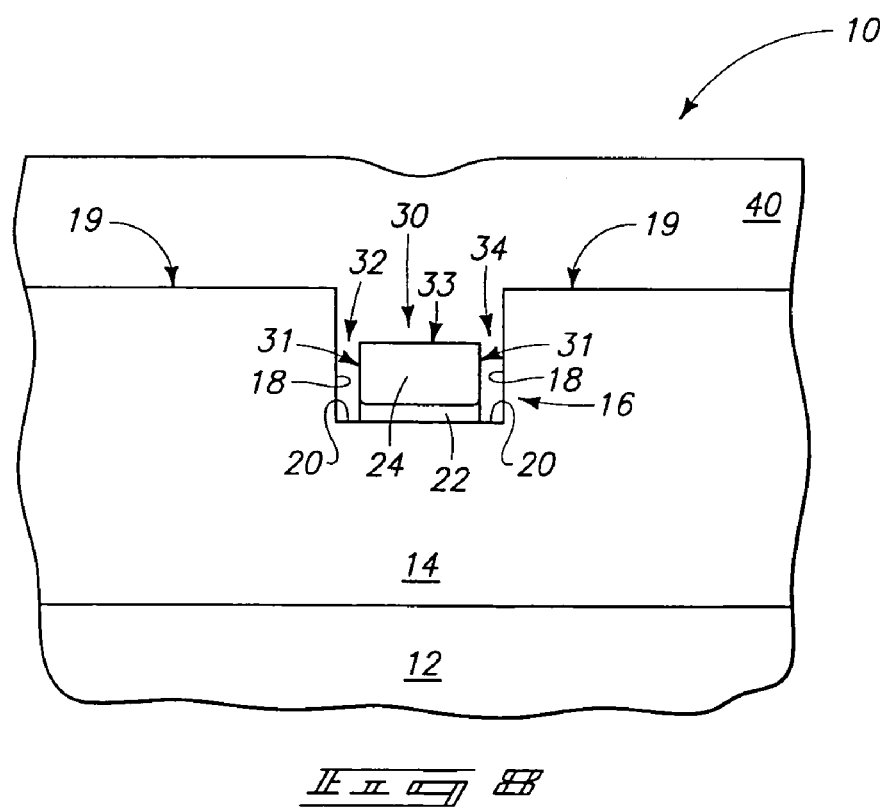

METHOD OF FORMING A CONDUCTIVE LINE AND A METHOD OF FORMING A CONDUCTIVE CONTACT ADJACENT TO AND INSULATED FROM A CONDUCTIVE LINE

RELATED PATENT DATA

This patent resulted from a divisional application of U.S. patent application Ser. No. 10/925,158, filed Aug. 23, 2004 now U.S. Pat. No. 7,118,966, entitled "Methods of Forming Conductive Lines", naming Scott A. Southwick, Alex J. Schrinsky and Terrence B. McDaniel as inventors, the disclosure of which is incorporated by reference.

TECHNICAL FIELD

This invention relates to methods of forming conductive lines, and to methods of forming conductive contacts adjacent conductive lines.

BACKGROUND OF THE INVENTION

Integrated circuits are typically formed on a semiconductor substrate, such as a silicon wafer or other semiconductive material. In general, layers of various materials which are either semiconducting, conducting or insulating, are utilized to form the integrated circuits. By way of example, various materials are doped, ion implanted, deposited, etched, grown, etc. using various processes. A continuing goal in semiconductor processing is to reduce the size of individual electronic components, thereby enabling smaller and denser integrated circuitry.

One type of integrated circuitry comprises memory circuitry, for example dynamic random access memory (DRAM). Such comprises an array of memory cells where individual cells include a transistor and a capacitor. The capacitor electrically connects with one of the source/drain regions of the transistor and a bit or a digit line electrically connects with the other of the source/drain regions of the transistor. DRAM circuitry might be constructed such that the capacitors are elevationally higher within the substrate than the bit line (buried bit line construction), or alternately with the bit line fabricated elevationally higher or outwardly of the capacitor (bit line-over-capacitor construction). The invention was principally motivated in addressing issues associated with buried bit line memory circuitry, although the invention is in no way so limited, nor is it limited to memory integrated circuitry. Rather, the invention is limited only by the accompanying claims as literally worded without interpretative or limiting reference to the specification and drawings herein, and in accordance with the doctrine of equivalents.

SUMMARY

This invention includes methods of forming conductive lines, and methods of forming conductive contacts adjacent conductive lines. In one implementation, a method of forming a conductive line includes forming a conductive line within an elongated trench within first insulative material over a semiconductive substrate. The conductive line is laterally spaced from opposing first insulative material sidewall surfaces of the trench. The conductive line includes a second conductive material received over a different first conductive material. The second conductive material is recessed relative to an elevationally outer surface of the first insulative material proximate the trench. A second insulative material different from the first insulative material is formed within the trench over a top surface of the conductive line and within laterally opposing spaces received between the first insulative material and the conductive line. In one implementation, a conductive contact is formed adjacent to and insulated from the conductive line. Such can be formed by etching a contact opening into the first insulative material proximate the conductive line using an etching chemistry which is substantially selective to the second insulative material. Conductor material is formed within the contact opening.

Other aspects and implementations are contemplated.

BRIEF DESCRIPTION OF THE DRAWINGS

Preferred embodiments of the invention are described below with reference to the following accompanying drawings.

FIG. 1 is a diagrammatic top plan view of a portion of a semiconductor wafer fragment in process in accordance with an aspect of the invention.

FIG. 2 is a diagrammatic sectional view taken through line 2-2 in FIG. 1.

FIG. 7 is a view of the FIG. 4 substrate at an alternate processing to that depicted by FIG. 5.

FIG. 8 is a view of the FIG. 6 substrate at a processing subsequent to that shown by FIG. 6.

DETAILED DESCRIPTION OF THE PREFERRED EMBODIMENTS

Figure 3:
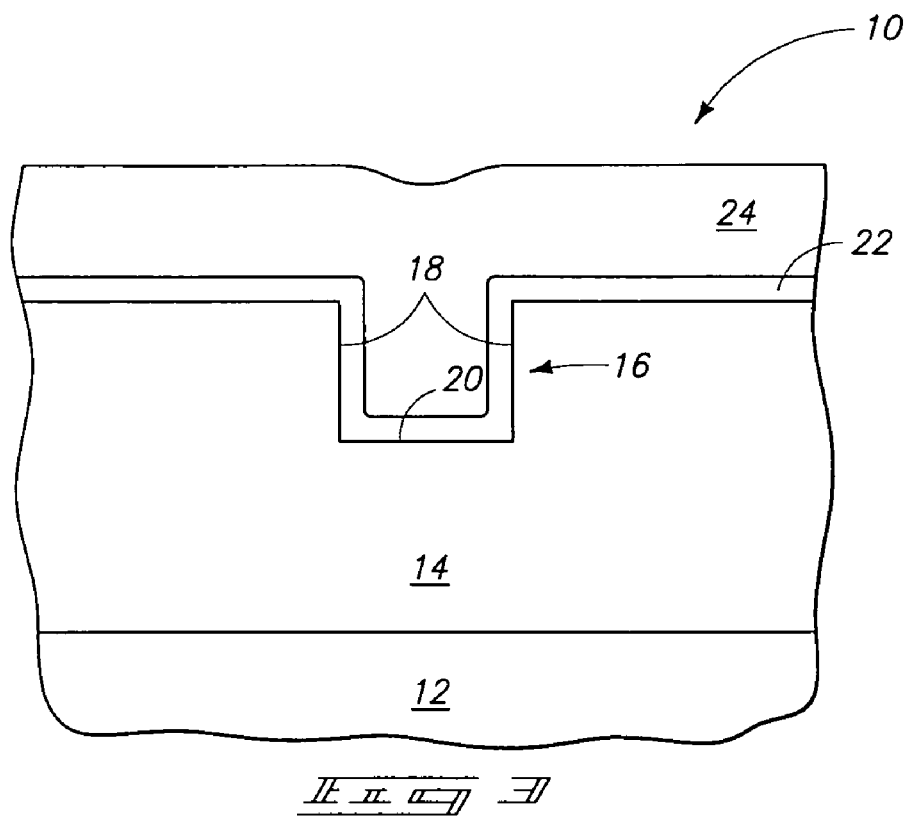
FIG. 3 is a view of the FIG. 2 substrate at a processing subsequent to that shown by FIG. 2.

This disclosure of the invention is submitted in furtherance of the constitutional purposes of the U.S. Patent Laws "to promote the progress of science and useful arts" (Article 1, Section 8).

Exemplary preferred embodiments of methods of forming a conductive line, and of forming a conductive contact adjacent a conductive line, are described with reference to exemplary implementations depicted by FIGS. 1-12. Referring initially to FIGS. 1 and 2, a semiconductor substrate fragment is indicated generally with reference numeral 10. Such comprises a semiconductor substrate 12, for example bulk monocrystalline silicon, having an insulative material 14 formed thereover. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Accordingly, semiconductor substrate 12 might comprise a plurality of insulative, conductive and semiconductive materials, including at least one semiconductive material. By way of example only, an exemplary material is bulk monocrystalline silicon, although of course, semiconductor-on-insulator and other substrates are also contemplated, whether existing or yet-to-be developed. Insulative material 14 can be considered as a first insulative material for reference purposes, and not necessarily a first-in-time insulative material formed over semiconductor substrate 12. First insulative material 14 might comprise a plurality of different insulative materials and/or layers.

An elongated trench 16 is formed into first insulative material 14 over semiconductor substrate 12. By way of example only, an exemplary width range for trench 16 is from 10 Angstroms to 100 microns, with an exemplary depth range for trench 16 being from 10 Angstroms to 200 microns. Such can be formed by photolithographic patterning and etch using any existing or yet-to-be developed methods. In one implementation, trench 16 can be considered as having opposing sidewall surfaces 18 and a base surface 20. In the illustrated preferred embodiment, opposing sidewall surfaces 18 are essentially parallel and vertical, and base surface 20 extends horizontally therebetween, joining therewith at right angles. Sloped and other than straight sidewall and base surfaces are also of course contemplated. An exemplary preferred first insulative material 14 comprises a silicon oxide doped with at least one of phosphorus and boron, for example borophosphosilicate glass (BPSG). Other, and more than one, materials are also of course contemplated for first insulative material 14. In the preferred embodiment, first insulative material 14 is depicted as having an elevationally outer surface 19, and which is substantially planar at least proximate trench 16.

Referring to FIG. 3, a first conductive material 22 is deposited to line trench 16, and a second conductive material 24 is deposited thereover to within trench 16 effective to fill the remaining volume thereof. An exemplary preferred thickness range for first conductive material layer 22 is from 10 Angstroms to 1000 Angstroms, while that for second conductive material layer 24 is from 10 Angstroms to 100 microns. In one exemplary embodiment, first conductive material 22 comprises titanium, for example in any of elemental, alloy and/or compound forms. In one particular preferred embodiment, first conductive material 22 comprises a composite of at least two different conductive layers, for example an elemental titanium layer and a titanium nitride layer formed thereover, for example to the same or different thicknesses relative one another. Further exemplary composites of two different materials include an initial titanium layer having a tungsten nitride layer formed thereover. Further by way of example only, additional examples include tungsten over titanium; tungsten over titanium nitride over titanium; tungsten over tungsten nitride over titanium nitride; tungsten over tantalum nitride; and tungsten over tungsten nitride over titanium enriched titanium nitride. Further by way of example only, an exemplary second conductive material 24 comprises at least one of tungsten, conductively doped polysilicon, aluminum, copper, nickel and a conductive metal silicide.

Figure 4:
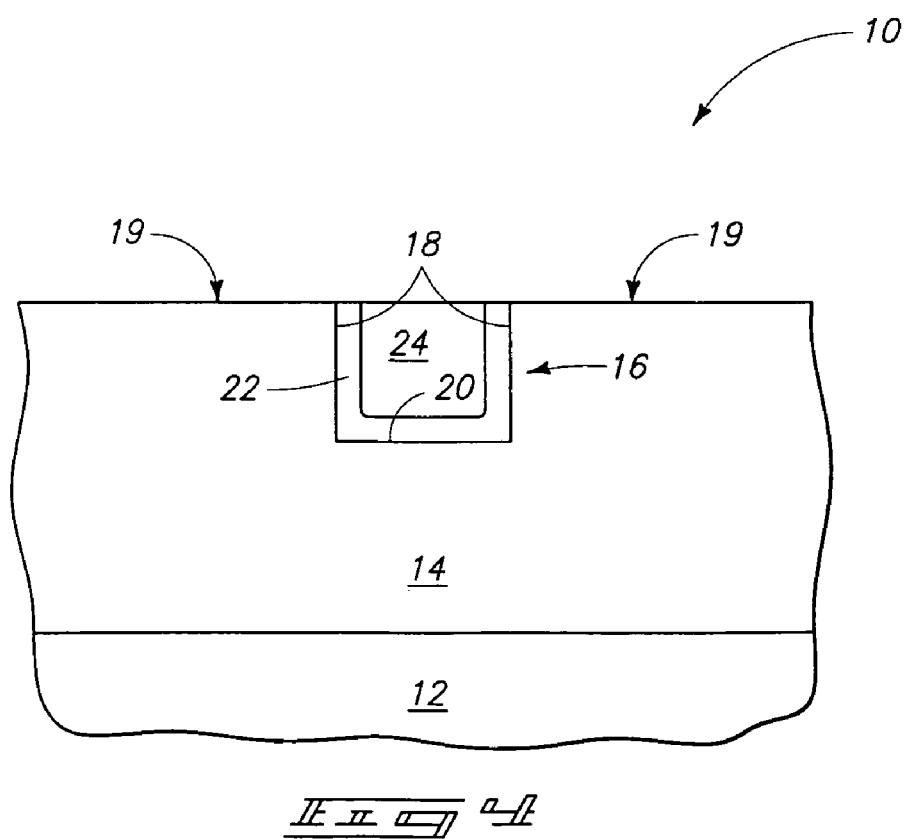
FIG. 4 is a view of the FIG. 3 substrate at a processing subsequent to that shown by FIG. 3.

Referring to FIG. 4, first and second conductive materials 22 and 24, respectively, have been removed from outwardly of outer surface 19, and to leave conductive materials 22 and 24 within trench 16. An exemplary preferred technique for doing so is by polishing (for example chemical-mechanical polishing) conductive materials 22 and 24 back to at least elevationally outer surface 19 proximate trench 16, and of course might include some removal of material 14 commensurate therewith and some removal of materials 22 and 24 received within trench 16 effective to reduce the thickness of such trench and the material received therein. However most preferably, the preferred removing or polishing action is such to effectively stop on outer surface 19 or proximate thereto.

Such describes in the depicted and preferred embodiment, an example of but only one preferred method of forming at least first and second different conductive materials within a trench, wherein the first conductive material lines the trench and the second conductive material is received over the first conductive material. However, any method of so forming as just stated is contemplated and whether existing or yet-to-be developed.

Figure 5:
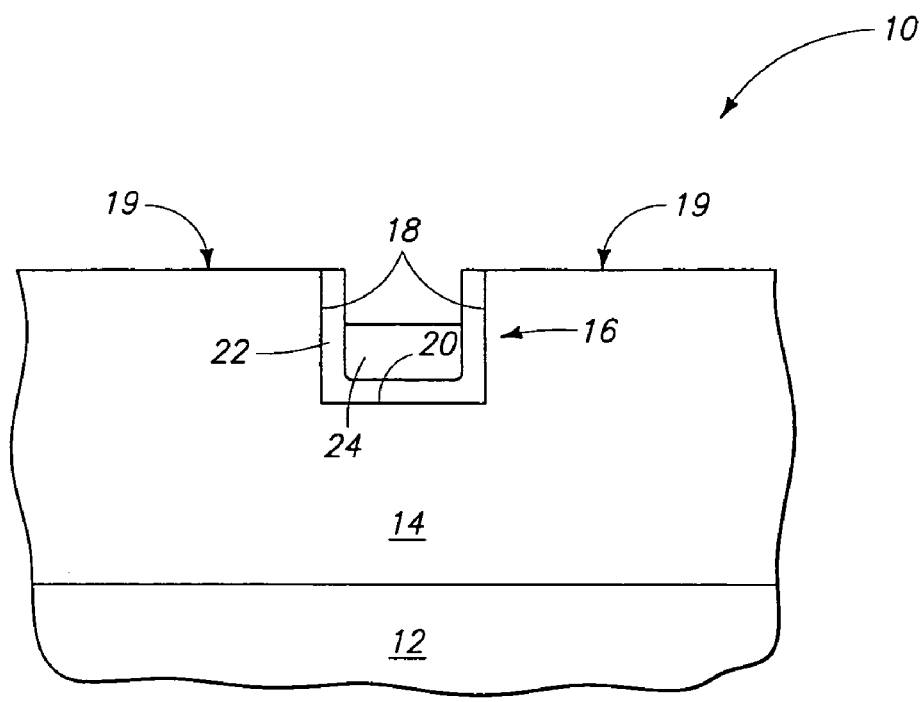
FIG. 5 is a view of the FIG. 4 substrate at a processing subsequent to that shown by FIG. 4.

Referring to FIG. 5, second conductive material 24 has been removed from trench 16 effective to recess second conductive material 24 relative to elevationally outer surface 19 of first insulative material 14 proximate trench 16. Preferred techniques for doing so include etching, for example one or a combination of dry etching and wet etching. For example where second conductive material 24 comprises elemental tungsten, an exemplary dry etching gas is $NF_3$ using an inductively coupled reactor having zero bias/power on the lower electrode and from 150 to 250 Watts of power on the upper electrode. Exemplary temperature and pressure conditions include a substrate temperature at from 40° C. to 140° C., with 70° C. being a specific example, and from 7 mTorr to 15 mTorr, with 10 mTorr being a specific example. An exemplary preferred flow rate for the $NF_3$ is from 5 sccm to 20 sccm, with 15 sccm being a specific example for a six liter volume chamber. Preferably, the removing of second conductive material 24 is conducted substantially selectively relative to first conductive material 22, and also substantially selectively relative to first insulative material 14. In the context of this document, a substantially selective etch or removal is at a rate of at least 2:1 of one material relative to a stated another material. The above-described $NF_3$ processing, by way of example only, is substantially selective to remove elemental tungsten material 24 selectively relative to BPSG material 14 and a titanium/titanium nitride composite for material 22, and at an etch rate of about 17 Angstroms per second. An exemplary preferred wet etching chemistry for selectively removing second conductive material 24 relative to the stated materials 14 and 22 includes an ammonia peroxide-comprising solution or an HF solution.

In one preferred implementation, the removal of second conductive material 24 recesses the second conductive material from 500 Angstroms to 300 Angstroms from elevationally outer surface 19 proximate trench 16, with a recess of 1,000 Angstroms being a specific example.

Figure 6:
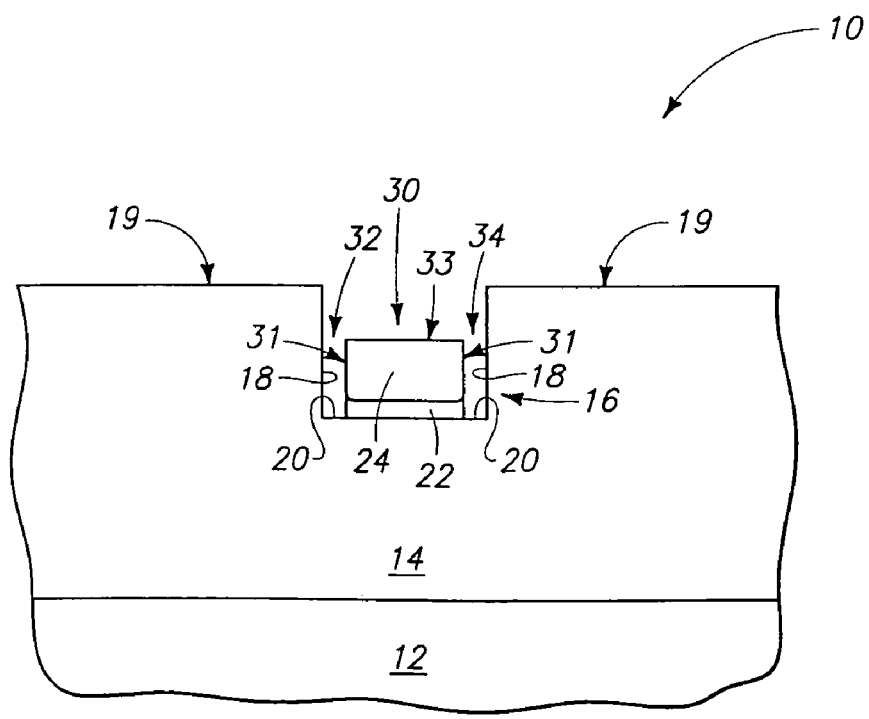
FIG. 6 is a view of the FIG. 5 substrate at a processing subsequent to that shown by FIG. 5.

Referring to FIG. 6, first conductive material 22 has been removed from opposing sidewall surfaces 18 of trench 16 effective to form a conductive line 30 within trench 16 comprising second conductive material 24 received over first conductive material 22. Such removing is preferably by etching, for example one or a combination of wet etching and dry etching. Preferably, such etching is also ideally substantially selective relative to second conductive material 24, and also substantially selective relative to first insulative material 14. In the depicted and exemplary preferred embodiment, the first conductive material etching from the trench is effective to create slots 32 and 34 which extend along opposing sidewall surfaces 18 of trench 16, with the depicted preferred embodiment slots extending completely to base surface 20 of insulative material 14 of trench 16. Slots or spaces 32, 34, of course, might not extend all the way to base 20. Further in the depicted preferred embodiment, the etching is effective to form conductive line 30 to have laterally opposing substantially vertical sidewalls 31 extending from first insulative material 14, and from base 20 thereof, to an elevationally outer surface 33 of second conductive material 24.

By way of example only, an exemplary preferred dry etch for a first material composite of elemental titanium and titanium nitride includes $Cl_2$ in an inductively coupled reactor where the top electrode is powered from 100 to 1000 Watts and the bottom electrode is powered from 10 to 500 Watts. An exemplary preferred temperature range and specific example is as described above in connection with the second conductive material etch, with an exemplary preferred pressure range being from 5 mTorr to 100 mTorr, with 10 mTorr being a specific example. An exemplary preferred flow rate for the $Cl_2$ is from 15 sccm to 100 sccm, with 90 sccm being a specific example. Such etching conditions can selectively etch first conductive material 22 substantially selectively relative to tungsten and BPSG. An exemplary preferred wet etching chemistry for selectively removing first conductive material 22 substantially selectively relative to the stated materials 14 and 24 includes hot phosphoric acid.

In one preferred embodiment, the removal of the first conductive material and the removal of the second conductive material is conducted in the same chamber under subatmospheric conditions without breaking the vacuum between such removals.

FIGS. 5 and 6 depict an exemplary method whereby the removal of the second conductive material occurs prior to removing the first conductive material. However, the reverse is also contemplated whereby removal of the first conductive material occurs prior to removal of the second conductive material, by way of example only, as shown in FIG. 7 with respect to a substrate fragment 10a. Such depicts an alternate processing to that of FIG. 5, whereby first conductive material 22 has been removed, preferably by etching, for example using the exemplary above chemistry for first material 22, and preferably forming the depicted slots 32a and 34a. Subsequent processing would be conducted for removing second conductive material 24 from the FIG. 7 construction, for example to result in the depicted FIG. 6 construction.

By way of example only, the above processing describes and depicts exemplary methods of forming a conductive line within an elongated trench within first insulative material over a semiconductive substrate. Such conductive line is laterally spaced from opposing first insulative material sidewall surfaces of the trench. The conductive line comprises a second conductive material received over a different first conductive material, with the second conductive material being recessed relative to an elevationally outer surface of the first insulative material proximate the trench. Any other method of so forming, whether existing or yet-to-be developed, is also contemplated with the above-described FIGS. 1-7 embodiment constituting but one preferred implementation.

Figure 9:
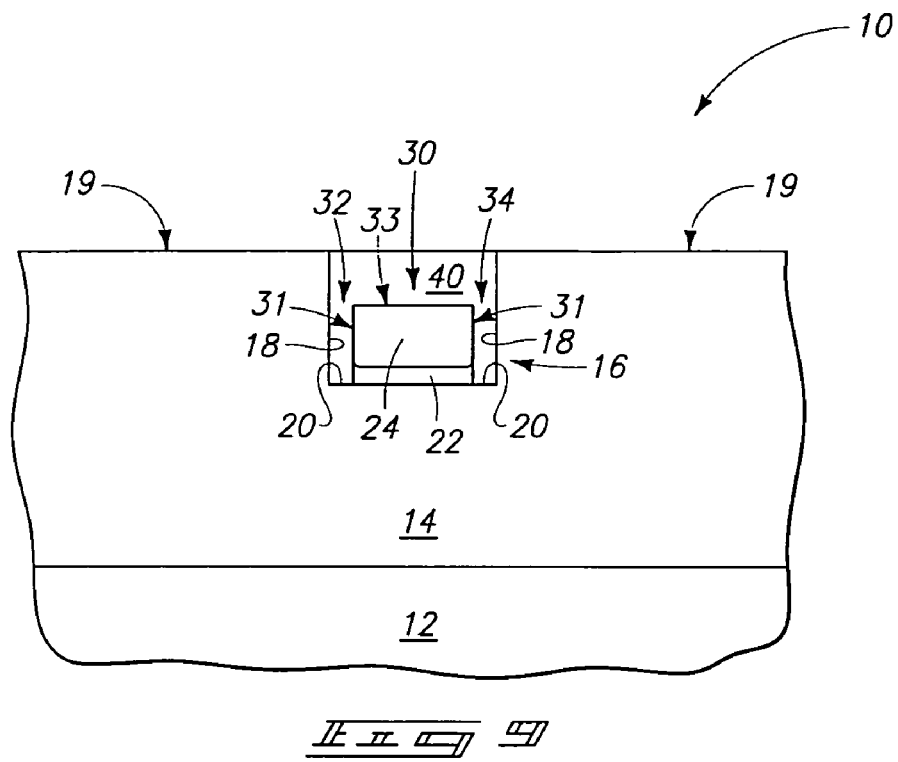
FIG. 9 is a view of the FIG. 8 substrate at a processing subsequent to that shown by FIG. 8.

Referring to FIG. 8, a second insulative material 40, different from first insulative material 14, has been deposited to within trench 16 over top and side surfaces of conductive line 30, and to within trench slots 32 and 34 in the depicted preferred embodiment. By way of example only, and for example where first insulative material 14 comprises BPSG, an exemplary second insulative material 40 is silicon nitride. Such provides but one example of forming a second insulative material, different from the first insulative material, within the trench over a top surface of the conductive line and within laterally opposing spaces received between the first insulative material and the conductive line. In one preferred embodiment, for example as shown in FIG. 9, second insulative material 40 is removed from outwardly of first insulative material 14 at least to the outer surface thereof, for example by a polishing action such as chemical-mechanical polishing. Further by way of example only in FIG. 9, first insulative material 14 and second insulative material 40 are formed to have planar outermost surfaces, and which in the depicted preferred example are co-planar.

Figure 10:
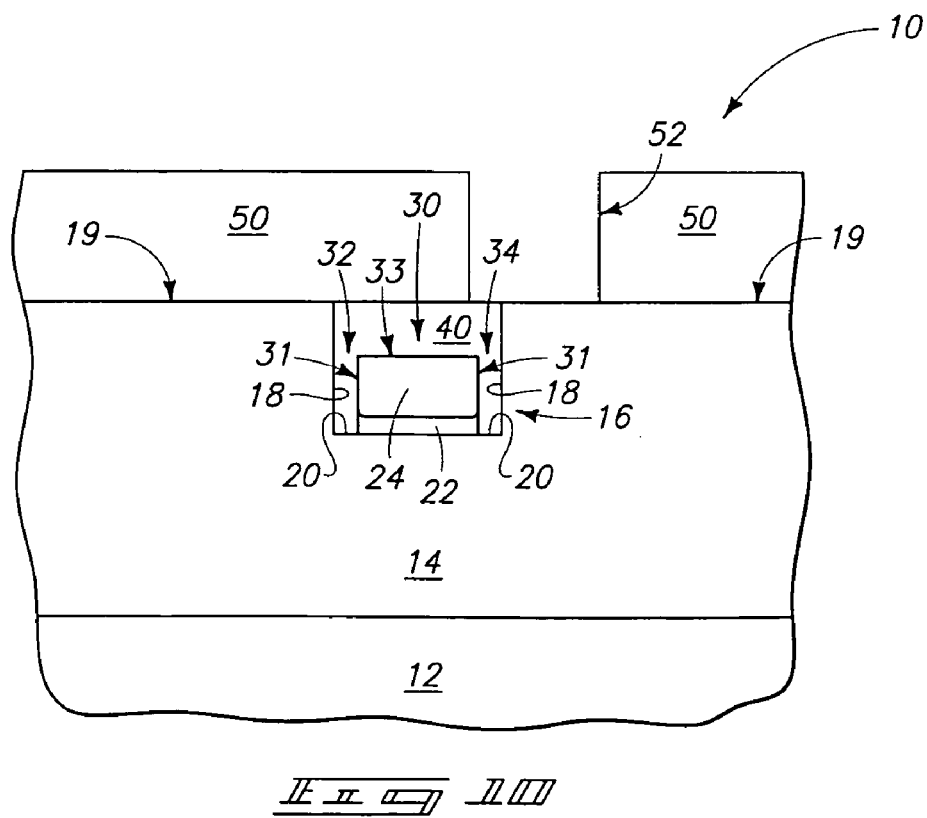
FIG. 10 is a view of the FIG. 9 substrate at a processing subsequent to that shown by FIG. 9.
Figure 11:
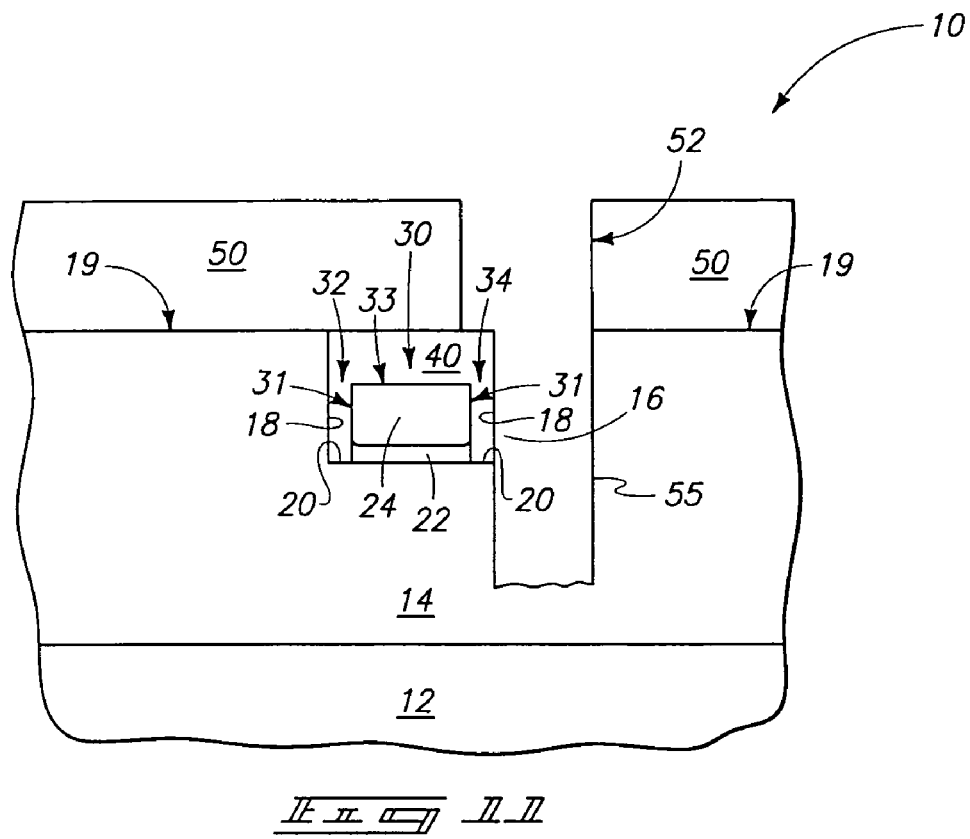
FIG. 11 is a view of the FIG. 10 substrate at a processing subsequent to that shown by FIG. 10.
Figure 12:
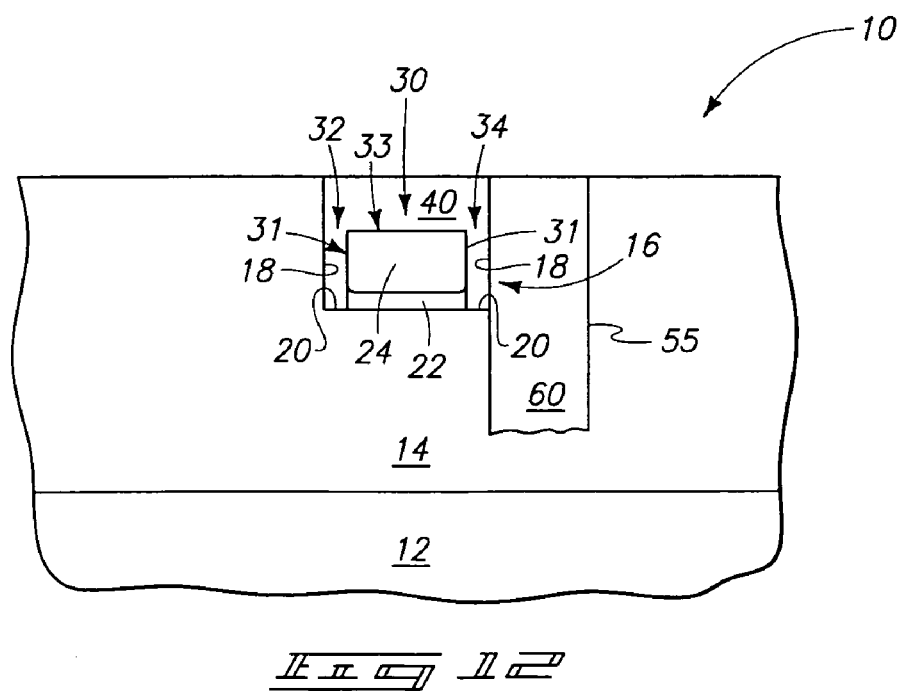
FIG. 12 is a view of the FIG. 11 substrate at a processing subsequent to that shown by FIG. 11

The invention also contemplates forming a conductive contact adjacent to and isolated/insulated from a conductive line, for example as is described by way of example only in connection with FIGS. 10-12. FIG. 10 depicts substrate fragment 10 as comprising an etch mask 50, for example photoresist, multi-level resist, or one or more etch hard masking materials. A mask opening 52 has been formed within etch mask 50, and in the depicted embodiment shows some degree of misalignment resulting in mask opening 52 overlying at least a portion of second insulative material 40.

Referring to FIG. 11, a contact opening 55 has been etched into first insulative material 14 proximate conductive line 30, and in the depicted preferred embodiment through mask opening 52, using an etching chemistry which is substantially selective to the removal of first insulative material 14 relative to second insulative material 40. Ideally, contact opening 55 would extend to some conductive or semiconductive region or material either within first insulative material 14 or to some portion of substrate 12, for making electrical connection therewith. By way of example only where first insulative material 14 comprises BPSG and second insulative material 40 comprises silicon nitride, an exemplary etching chemistry includes a combination of $C_4F_6$, $C_4F_8$, $O_2$ and Ar.

Referring to FIG. 12, etch mask 50 has been removed from substrate 10, and a conductor material 60 formed within contact opening 55. Such might comprise one or more conductive and/or semiconductive materials, for example conductively doped polysilicon, elemental metals and conductive metal nitrides. In the depicted preferred and exemplary embodiment, conductor material 60 within contact opening 55 contacts second insulative material 40.

In one preferred embodiment, the conductive line comprises a buried digit line of DRAM circuitry, for example and by way of example only as shown in U.S. Pat. Nos. 6,376,380 and 6,337,274, which are herein incorporated by reference.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a conductive line, comprising: forming a conductive line within an elongated trench within first insulative material over a semiconductive substrate, the conductive line being everywhere laterally spaced from opposing first insulative material sidewall surfaces of the trench, the conductive line comprising a second conductive material received over a different first conductive material, the second conductive material being recessed elevationally relative to an elevationally outer surface of the first insulative material proximate the trench; and forming a second insulative material different from the first insulative material within the trench over a top surface of the conductive line and within laterally opposing spaces received between the first insulative material and the conductive line.

2. The method of claim 1 wherein the second conductive material comprises at least one of tungsten, conductively doped polysilicon, aluminum, copper, nickel and a conductive metal silicide.

3. The method of claim 2 the second conductive material comprises elemental tungsten.

4. The method of claim 1 wherein the first conductive material comprises titanium.

5. The method of claim 4 wherein the first conductive material comprises a composite of elemental titanium and titanium nitride layers.

6. The method of claim 5 the second conductive material comprises elemental tungsten.

7. The method of claim 1 wherein the first insulative material comprises silicon oxide doped with at least one of phosphorus and boron, and the second insulative material comprises silicon nitride.

8. The method of claim 1 wherein the second conductive material is recessed from 500 Angstroms to 3000 Angstroms from said elevationally outer surface of the first insulative material.

9. The method of claim 1 wherein the elevationally outer surface of the first insulative material is substantially planar at least proximate the trench, the forming of the second insulative material comprising depositing the second insulative material and polishing it back at least to said elevationally outer surface of the first insulative material.

10. The method of claim 1 wherein the first and second insulative materials are formed to have planar outermost surfaces, and which are coplanar.

11. The method of claim 1 wherein the conductive line comprises a buried digit line of DRAM circuitry.

12. A method of forming a conductive contact adjacent to and insulated from a conductive line, comprising:
forming a conductive line within an elongated trench within first insulative material over a semiconductive substrate, the conductive line being everywhere laterally spaced from opposing first insulative material sidewall surfaces of the trench, the conductive line comprising a second conductive material received over a different first conductive material, the second conductive material being recessed elevationally relative to an elevationally outer surface of the first insulative material proximate the trench;
forming a second insulative material different from the first insulative material within the trench over a top surface of the conductive line and within laterally opposing spaces received between the first insulative material and the conductive line;
etching a contact opening into the first insulative material proximate the conductive line using an etching chemistry which is substantially selective to the second insulative material; and
forming conductor material within the contact opening.

13. The method of claim 12 wherein the conductor material contacts the second insulative material.

14. The method of claim 12 wherein the etching comprises using an etch mask having a mask opening therein through which the first insulative material is etched, the mask opening overlapping the second insulative material.

15. The method of claim 14 wherein the conductor material contacts the second insulative material.

16. The method of claim 12 wherein the second conductive material comprises at least one of tungsten, conductively doped polysilicon, aluminum, copper, nickel and a conductive metal silicide.

17. The method of claim 16 the second conductive material comprises elemental tungsten.

18. The method of claim 12 wherein the first conductive material comprises titanium.

19. The method of claim 18 wherein the first conductive material comprises a composite of elemental titanium and titanium nitride layers.

20. The method of claim 19 the second conductive material comprises elemental tungsten.

21. The method of claim 12 wherein the first insulative material comprises silicon oxide doped with at least one of phosphorus and boron, and the second insulative material comprises silicon nitride.

22. The method of claim 12 wherein the second conductive material is recessed from 500 Angstroms to 3000 Angstroms from said elevationally outer surface of the first insulative material.

23. The method of claim 12 wherein the elevationally outer surface of the first insulative material is substantially planar at least proximate the trench, the forming of the second insulative material comprising depositing the second insulative material and polishing it back at least to said elevationally outer surface of the first insulative material.

24. The method of claim 12 wherein the conductive line comprises a buried digit line of DRAM circuitry.

25. A method of forming a conductive line, comprising:
forming a conductive line within an elongated trench within first insulative material over a semiconductive substrate, the conductive material sidewall surfaces of the trench, the conductive line comprising a second conductive material received over a different first conductive material, the second conductive material being recessed elevationally relative to an elevationally outer surface of the first insulative material proximate the trench; and
forming a second insulative material different from the first insulative material within the trench over a top surface of the conductive line and within laterally opposing spaces received between the first insulative material and conductive line, the forming of the second insulative material comprising depositing the second insulative material and polishing it back at least to the first insulative material.

26. A method of forming a conductive contact adajacent to and insulated from a conductive line, comprising:
forming a conductive line within an elongated trench within first insulative material over a semiconductive substrate, the conductive line being everywhere laterally spaced from opposing first insulative material sidewall surfaces of the trench, the conductive line comprising a second conductive material received over a different first conductive material, the second conductive material being recessed elevationally relative to an elevationally outer surface of the first insulative material proximate the trench;
forming a second insulative material different from the first insulative material within the trench over a top surface of the conductive line and within laterally opposing spaces received between the first insulative material and the conductive line, the forming of the second insulative material comprising depositing the second insulative material and polishing it back at least to the first insulative material;
etching a contact opening into the first insulative material proximate the conductive line using an etching chemistry which is substantially selective to the second insulative material; and forming conductor material within the contact opening.

27. A method of forming a conductive contact adjacent to and insulated from a conductive line, comprising:

forming a conductive line within an elongated trench within first insulative material over a semiconductive substrate, the conductive line being everywhere laterally spaced from opposing first insulative material sidewall surfaces of the trench, the conductive line comprising a second conductive material received over a different first conductive material, the second conductive material being recessed elevationally relative to an elevationally outer surface of the first insulative material proximate the trench;

forming a second insulative material different from the first insulative material within the trench over a top surface of the conductive line and within laterally opposing spaces received between the first insulative material and the conductive line, the forming of the second insulative material comprising depositing the second insulative material and polishing it back at least to the first insulative material;

etching a contact opening into the first insulative material proximate the conductive line using an etching chemistry which is substantially selective to the second insulative material, the etching exposing the second insulative material; and forming conductor material within the contact opening in contact with the second insulative material.

* * * * *

UNITED STATES PATENT AND TRADEMARK OFFICE
CERTIFICATE OF CORRECTION

PATENT NO. : 7,491,641 B2
APPLICATION NO. : 11/412524
DATED : February 17, 2009
INVENTOR(S) : Southwick et al.

It is certified that error appears in the above-identified patent and that said Letters Patent is hereby corrected as shown below:

In column 8, line 29, in Claim 25, after "conductive" insert -- line being everywhere laterally spaced from opposing first insulative --.

In column 8, line 39, in Claim 25, after "and" insert -- the --.

In column 8, line 44, in Claim 26, delete "adajacent" and insert -- adjacent --, therefor.

In column 10, lines 3-6, in Claim 27, delete "line, the forming of the second insulative material comprising depositing the second insulative material and polishing it back at least to the first insulative material;" and insert -- line; --, therefor.

Signed and Sealed this

Twenty-eighth Day of April, 2009

JOHN DOLL
*Acting Director of the United States Patent and Trademark Office*